US009246492B1

(12) United States Patent
Sood (10) Patent No.: US 9,246,492 B1
(45) Date of Patent: Jan. 26, 2016

(54) POWER GRID ARCHITECTURE FOR VOLTAGE SCALING IN PROGRAMMABLE INTEGRATED CIRCUITS

(71) Applicant: Xilinx, Inc., San Jose, CA (US)

(72) Inventor: Santosh Kumar Sood, New Delhi (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/749,509

(22) Filed: Jun. 24, 2015

(51) Int. Cl.
*H03K 19/0175* (2006.01)
*H03K 19/177* (2006.01)

(52) U.S. Cl.
CPC .. *H03K 19/017581* (2013.01); *H03K 19/17704* (2013.01)

(58) Field of Classification Search
CPC ............... H03K 19/17704; H03K 19/017581; H03K 19/0185; H03K 19/017509
USPC ................................. 326/37–41, 81
See application file for complete search history.

(56) References Cited

U.S. PATENT DOCUMENTS 9,013,223 B2* 4/2015 Hsiao ............. H03K 19/017509
326/80
2011/0221502 A1* 9/2011 Meijer ........... G01R 31/318508
327/333
2013/0106395 A1* 5/2013 Del Croce ................. G05F 3/02
323/315
2014/0210516 A1* 7/2014 Hwang .......... H03K 19/018507
326/80

OTHER PUBLICATIONS

U.S. Appl. No. 14/507,260, filed Oct. 6, 2014, Sood, Santosh Kumar, San Jose, CA, USA.
U.S. Appl. No. 14/462,370, filed Aug. 18, 2014, Devlin, Benjamin S., et al, San Jose, CA, USA.

* cited by examiner

*Primary Examiner* — Don Le
(74) *Attorney, Agent, or Firm* — Robert M. Brush (57) ABSTRACT

In one example, a programmable integrated circuit (IC) includes a first logic tile in a first power domain having a first local voltage. The first logic tile includes a driver operable to use the first local voltage to output a signal having a logic-level referenced to the first local voltage. The first logic tile further includes a level-shifter coupled to receive the signal from the driver and operable to output a level-shifted signal having a logic-level referenced to a global handshaking voltage. The programmable IC further includes a second logic tile in a second power domain having a second local voltage, the second logic tile including a receiver operable to use the second local voltage to receive the level-shifted signal. The global handshaking voltage is at least as high as the first local voltage and at least as high as the second local voltage.

20 Claims, 6 Drawing Sheets

POWER GRID ARCHITECTURE FOR VOLTAGE SCALING IN PROGRAMMABLE INTEGRATED CIRCUITS

TECHNICAL FIELD

Examples of the present disclosure generally relate to electronic circuits and, in particular, to a power grid architecture for voltage scaling in programmable integrated circuits.

BACKGROUND

Voltage scaling in integrated circuits (ICs) can be used to control power consumption. For example, the design for an application specific integrated circuit (ASIC) can be specified having a plurality of different power domains. Different blocks or subsystems can be designed for operation using different voltages. Level-shifters can be used at the interfaces between blocks/subsystems operating in different power domains. Since ASICs use structured floorplanning, level-shifters can access the source and destination voltages at the planned interfaces.

Programmable integrated circuits (ICs) are often used to implement digital logic operations according to user configurable input. Example programmable ICs include complex programmable logic devices (CPLDs) and field programmable gate arrays (FPGAs). One type of FPGA includes an array of programmable tiles. The programmable tiles have interfaces to adjacent tiles, as well as with non-adjacent tiles. The far-reaching signal boundaries of programmable tiles in a programmable IC, such as an FPGA, add complexity to any voltage scaling implementation. Specifically, the techniques used for ASICs cannot be applied to programmable ICs.

SUMMARY

Techniques for providing a power grid architecture for voltage scaling in programmable integrated circuits (ICs) are described. In an example, a programmable integrated circuit (IC) includes a first logic tile in a first power domain having a first local voltage. The first logic tile includes a driver operable to use the first local voltage to output a signal having a logic-level referenced to the first local voltage. The first logic tile further includes a level-shifter coupled to receive the signal from the driver and operable to output a level-shifted signal having a logic-level referenced to a global handshaking voltage. The programmable IC further includes a second logic tile in a second power domain having a second local voltage, the second logic tile including a receiver operable to use the second local voltage to receive the level-shifted signal. The global handshaking voltage is at least as high as the first local voltage and at least as high as the second local voltage.

In another example, a programmable IC includes a voltage rail operable to supply a global handshaking voltage. The programmable IC further includes a plurality logic tiles. Each of the plurality of logic tiles includes at least one driver each operable to use a local voltage to output a signal having a logic-level referenced to the local voltage. Each of the plurality of logic tiles includes at least one level-shifter each coupled to receive the signal from a respective driver and operable to output a level-shifted signal having a logic-level referenced to the global-handshaking voltage. Each of the plurality of logic tiles includes at least one receiver each operable to use the local voltage to receive an input signal having a logic-level referenced to the global-handshaking voltage. The global handshaking voltage is at least as high as the local voltage in each of the plurality of logic tiles.

In another example, a method of voltage scaling in a programmable IC includes configuring a first logic tile to be in a first power domain having a first local voltage; configuring a second logic tile to be in a second power domain having a second local voltage; and configuring an output of the first logic tile to be connected to an input of the second logic tile. The output of the first logic tile is driven by a driver operable to use the first local voltage to output a signal having a logic-level referenced to the first local voltage, and a level-shifter is coupled to receive the signal from the driver and is operable to output a level-shifted signal having a logic-level referenced to a global handshaking voltage. The input of the second logic tile is coupled to a receiver operable to use the second local voltage to receive the level-shifted signal. The global handshaking voltage is at least as high as the first local voltage and at least as high as the second local voltage.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing a power grid architecture for voltage scaling in programmable integrated circuits (ICs) are described. Programmable ICs, such as field programmable gate arrays (FPGAs), can employ power saving techniques to control system level power. Static voltage scaling can be used to conserve power on non-critical paths having enough slack by lowering the voltage, saving both dynamic and static power. Dynamic voltage scaling can be used to dynamically lower the voltage on such paths while operating, allowing for implementation of multiple power modes. FPGAs include interconnect modules (also referred to as interconnect elements or interconnect tiles) that have far-reaching signal boundaries. The techniques of implementing power domains in application specific circuits (ASICs) cannot be applied to FPGAs. The techniques described herein provide a power grid architecture in a programmable IC, such as an FPGA, that allows for implementation of voltage scaling in interconnect modules.

Figure 1A:
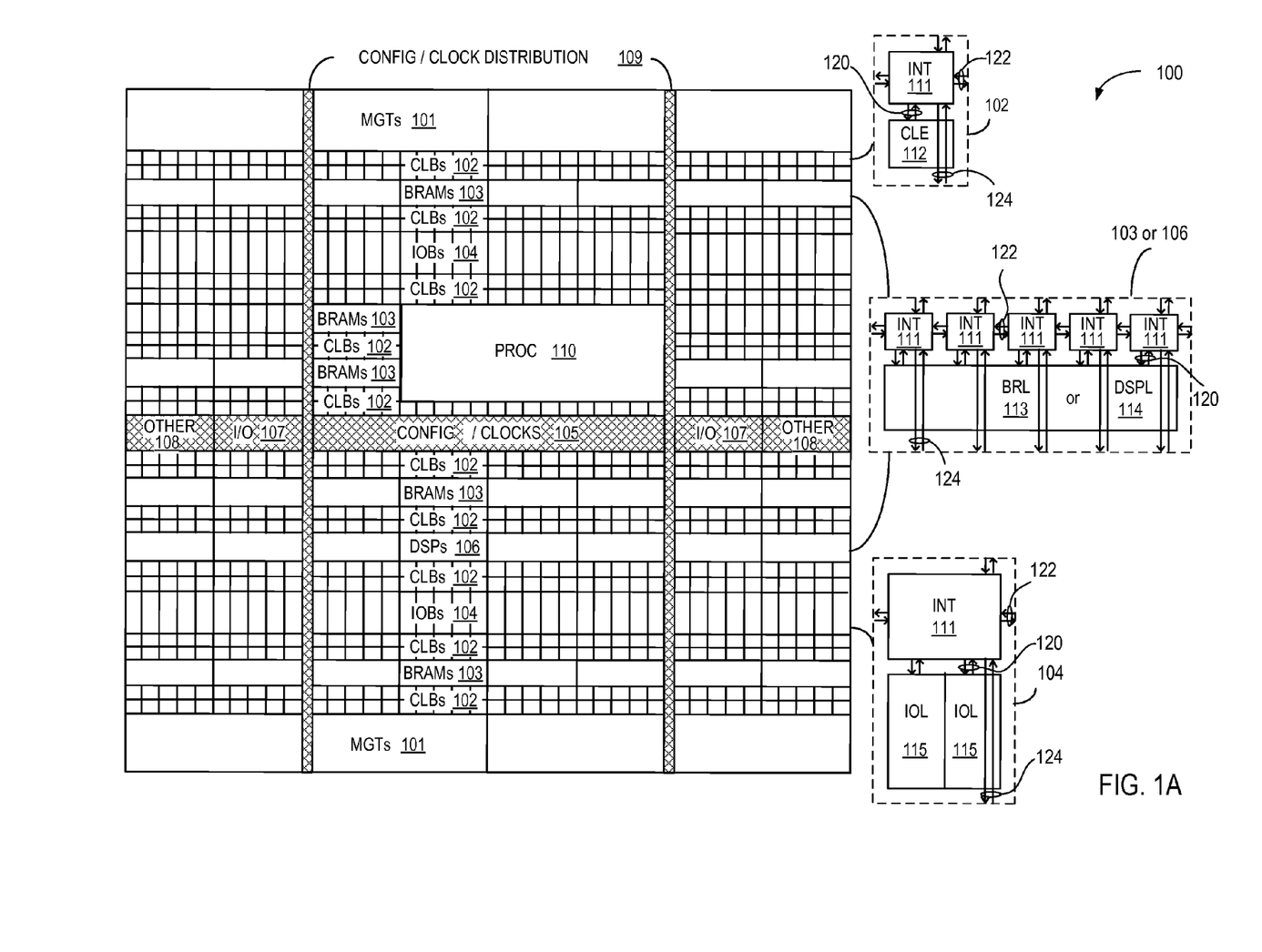
FIG. 1A illustrates an example architecture of an FPGA.

FIG. 1A illustrates an example architecture of an FPGA 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108, such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1A. Each programmable interconnect element 111 (also referred to as "interconnect element 111" or "interconnect tile 111") can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA. As described further below, in some examples, some or all of the interconnect elements 111 can include additional circuitry for efficient implementation of TCAMs.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1A) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1A include additional logic blocks that disrupt the regular columnar structure making up a large part of the FPGA. The additional logic blocks can be programmable blocks and/or dedicated logic. For example, processor block 110 spans several columns of CLBs and BRAMs. The processor block 110 can include various components ranging from a single microprocessor to a complete programmable processing system of microprocessor(s), memory controllers, peripherals, and the like.

Note that FIG. 1A is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1A are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 110. In such an implementation, a System-on-Chip (Soc) can include a programmable fabric (programmable logic as shown in FPGA 100) in communication with a processing system.

Figure 1B:
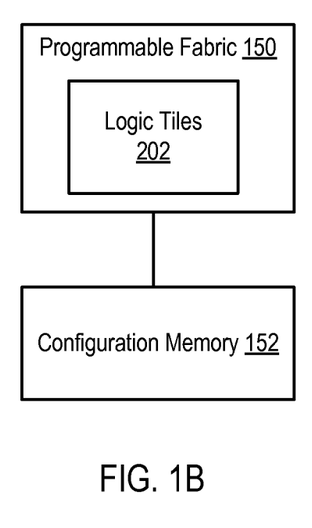
FIG. 1B is a block diagram depicting a higher-level view of the FPGA of FIG. 1 according to an example.

FIG. 1B is a block diagram depicting a higher-level view of the FPGA 100 according to an example. The FPGA 100 includes a programmable fabric 150, which can include the various logic tiles 202 as described above. The programmable fabric 150 is coupled to a configuration memory 152. The configuration memory 152 comprises a random access memory (RAM), such as a static RAM (SRAM) or the like. The configuration memory 152 can be loaded with a configuration bitstream for programming ("configuring") the programmable fabric 150. For example, a configuration bitstream can be loaded into the configuration memory 152 to configure multiple power domains among the logic tiles 202, as described herein.

Figure 2:
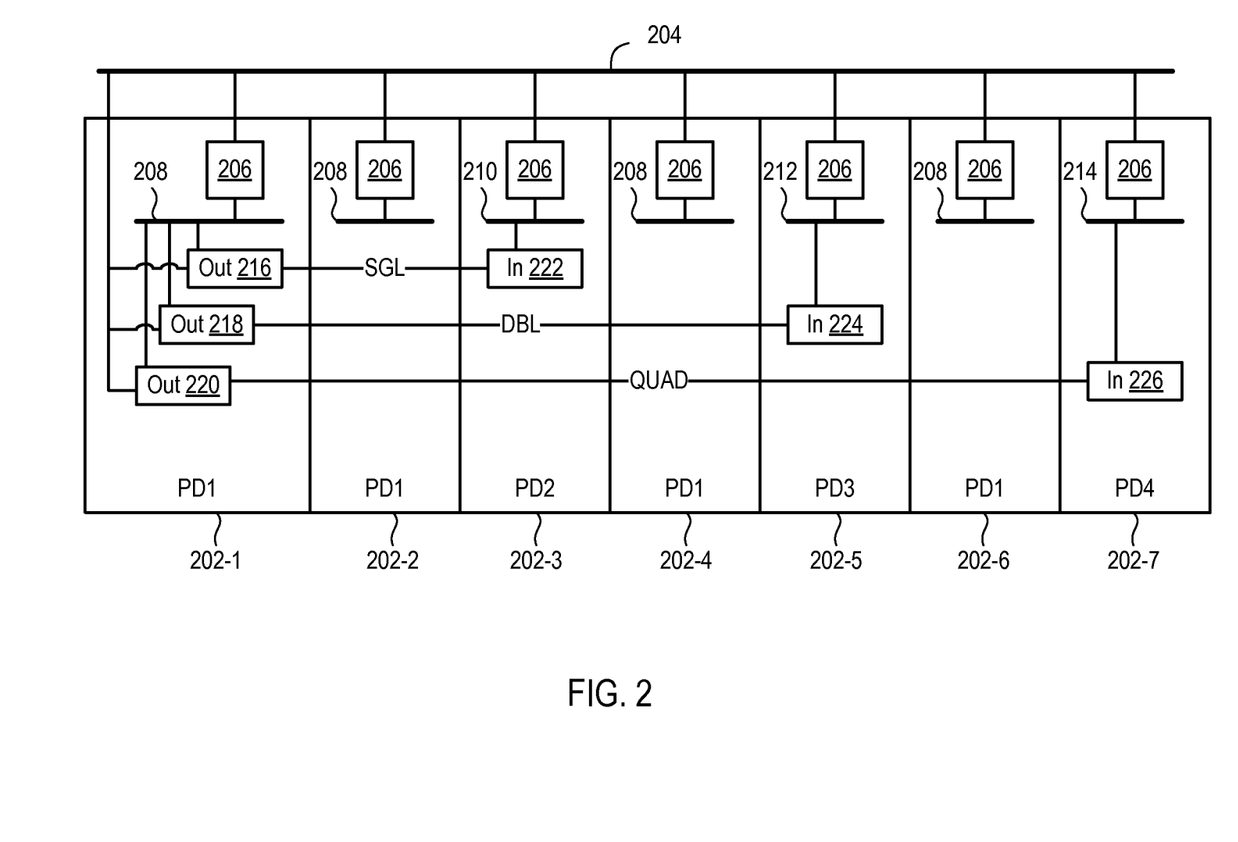
FIG. 2 is a block diagram showing a portion of the programmable fabric of the FPGA of FIG. 1.

FIG. 2 is a block diagram showing a portion of the programmable fabric 150 comprising a voltage rail 204 and logic tiles 202-1 through 202-7. Each of the logic tiles 202-1 through 202-7 includes a voltage control circuit 206. Each voltage control circuit 206 is coupled to receive a global handshaking voltage from the voltage rail 204. Each voltage control circuit 206 is operable to derive a local voltage from the global handshaking voltage. The local voltages can differ across different logic tiles to implement different power domains. In the example shown, the logic tiles 202-1, 202-2, 202-4, and 202-6 are part of a first power domain (PD1) having a local voltage 208. The logic tile 202-3 is part of a second power domain (PD2) having a local voltage 210. The logic tile 202-5 is part of a third power domain (PD3) having a local voltage 212. The logic tile 202-7 is part of a fourth power domain (PD4) having a local voltage 214. While four power domains are shown, the logic tiles 202-1 through 202-7 can implement more or less than four power domains.

Some logic tiles 202 can have signal connections to adjacent tiles. Some logic tiles 202 can have signal connections to non-adjacent tiles. Still other logic tiles 202 can have signal connections to both adjacent and non-adjacent tiles. In the example shown, the logic tile 202-1 has three signal connections to non-adjacent tiles, referred to as "SGL", "DBL", and "QUAD". The logic tile 202-1 includes an output circuit 216 that drives a signal on the signal connection SGL, which can be received by an input circuit 222 in the logic tile 202-3. The logic tile 202-1 includes an output circuit 218 that drives a signal on the signal connection DBL, which can be received by an input circuit 224 in the logic tile 202-5. The logic tile 202-1 includes an output circuit 220 that drives a signal on the signal connection QUAD, which can be received by an input circuit 226 in the logic tile 202-7. The logic tile 202-1 can also include adjacent connections and/or other non-adjacent connections (not shown). Each of the output circuits 216 is coupled to receive both the local voltage 208 in the logic tile 202-1 and the global handshaking voltage from the voltage rail 204. The input circuit 222 is coupled to receive the local voltage 210 in the logic tile 202-3. The input circuit 224 is coupled to receive the local voltage 212 in the logic tile 202-5. The input circuit 226 is coupled to receive the local voltage 214 in the logic tile 202-7.

In operation, the logic tile 202-1 generates a signal to be transmitted to the logic tile 202-3 through the output circuit 216. The logic tile 202-1 operates using the local voltage 208 to generate the signal. As such, within the logic tile 202-1, the signal includes a logic-level that is referenced to the local voltage 208. That is, the signal alternates between a reference voltage (e.g., ground) and the local voltage 208. The reference voltage is indicative of logic '0', and the local voltage 208 is indicative of logic '1'. The output circuit 216 includes a driver circuit (shown below) for driving the signal onto the signal connection SGL, and a level-shifter circuit (shown below) for shifting the logic-level of the signal to the global handshaking voltage. As such, the signal on the signal connection SGL output by the logic tile 202-1 has a logic-level referenced to the global handshaking voltage. That is, the signal on the signal connection SGL alternates between the reference voltage and the global handshaking voltage. The input circuit 222 is operable to use the local voltage 210 to receive the signal on the signal connection SGL. The input circuit 222 is tolerant of the logic-level of the signal on the signal connection SGL.

The logic tile 202-1 can generate signals to be transmitted to the logic tiles 202-5 and 202-7 through the output circuits 218 and 220, respectively, in the same manner. The signals on each of the signal connections DBL and QUAD are referenced to the global handshaking voltage using level-shifters in the output circuits 218 and 220, respectively. The input circuits 224 and 226 are tolerant of the logic-level of the signals on the signal connections DBL and QUAD, respectively.

Accordingly, the programmable fabric 150 can include fine granularity power domain control. For example, each of the logic tiles 202-1 through 202-7 can implement a power domain, which can be the same or different than other logic tiles. The row of logic tiles shown in FIG. 2 can include more or less than seven tiles. Further, one or more of such rows can be stacked to provide a matrix of tiles, each capable of implementing a local power domain. Each of the logic tiles 202 is coupled to receive the global handshaking voltage from the voltage rail 204. The fine granularity of power domain control provides flexibility when placing and routing designs in the programmable fabric 150, and avoids artificial constraints of grouping logic tiles into a single power domain. The logic tiles 202 can comprise any of the programmable logic tiles discussed above, such as CLBs (including CLE and interconnect tiles), IOBs, BRAMs, DSPs, etc.

Further, the global handshaking voltage is used as the interface voltage between any two power domains. In an example, the global handshaking voltage is at least as high as each of the local voltages. For example, the global handshaking voltage can be the highest voltage within the programmable fabric 150 that is used to generate the local voltages in the power domains. Level-shifters are included only at the signal source. Signals referenced to the global handshaking voltage drive the receiver circuits directly. In this manner, a logic tile does not require access to the different destination voltages of the different power domains to which it is connected. A given logic tile can transmit a signal to any other logic tile having any other power domain by shifting the output signal to be references to the global handshaking voltage. Use of the global handshaking voltages reduces complexity of the power grid architecture.

Figure 3:
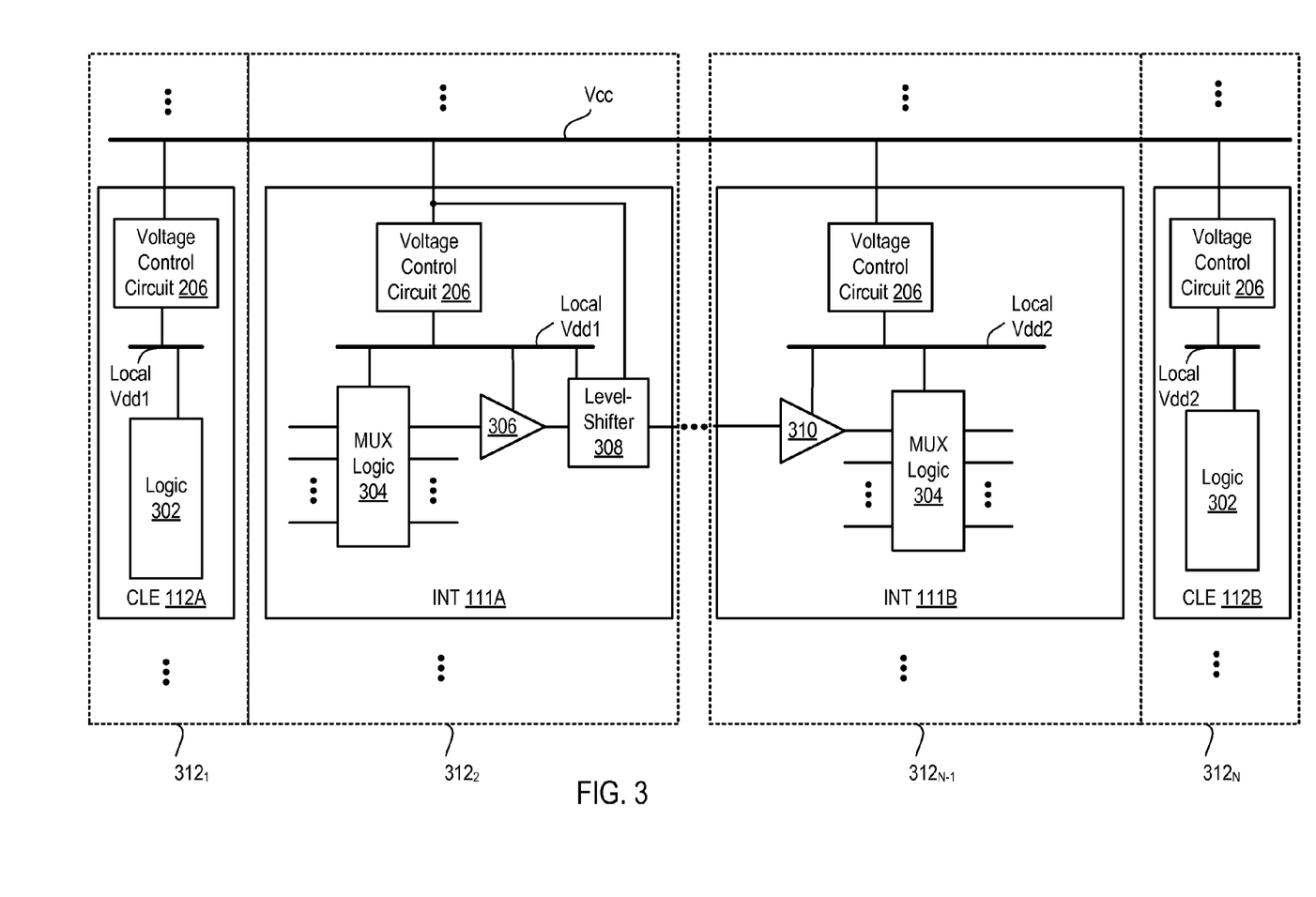
FIG. 3 is a block diagram depicting another portion of the programmable fabric of the FPGA of FIG. 1.

FIG. 3 is a block diagram depicting a portion of the programmable fabric 150 that includes tile columns $312_1$ through $312_N$, where N is a positive integer (collectively columns 312). Each of the columns 312 includes a plurality of logic tiles of a particular type. In the example, the column $312_1$ includes a plurality of CLE tiles 112 (e.g., a CLE tile 112A is shown). The column $312_2$ includes a plurality of interconnect elements 111 (e.g., an interconnect tile 111A is shown). The column $312_{N-1}$ includes a plurality of interconnect elements 111 (e.g., an interconnect tile 111B is shown). The column $312_N$ includes a plurality of CLE tiles 112 (e.g., a CLE tile 112B is shown). In an example, one or more columns of tiles can be disposed between the column $312_2$ and $312_{N-1}$. Alternatively, the column $312_2$ can be adjacent to the column $312_{N-1}$. The columns 312 shown in FIG. 3 can be repeated throughout the programmable fabric 150.

The CLE tile 112A includes a voltage control circuit 206 and logic 302. The voltage control circuit 206 derives a local voltage Vdd1 from the global handshaking voltage Vcc. The logic 302 operates using the local voltage Vdd1. The logic 302 can include lookup tables (LUTs), flip-flops, multiplexers, carry-chain logic, and the like.

The interconnect tile 111A includes a voltage control circuit 206, multiplexer (MUX) logic 304, a driver 306, and a level-shifter 308. The voltage control circuit 206 derives the local voltage Vdd1 from the global handshaking voltage Vcc. The MUX logic 304 includes a plurality of inputs and a plurality of outputs. Some of the inputs to the MUX logic 304 can be coupled to outputs of the CLE tile 112A, while others of the inputs can be coupled to other logic tiles (not shown). One of the outputs of the MUX logic 304 is coupled to an input of the driver 306. An output of the driver 306 is coupled to an input of the level-shifter 308. The MUX logic 304 and the driver 306 operate using the local voltage Vdd1. The level-shifter 308 operates using both the local voltage Vdd1 and the global handshaking voltage Vcc. For example, the level-shifter 308 can comprise a dual-supply level-shifter circuit. Various types of dual-supply level-shifter circuits are known in the art and thus the details thereof are omitted. While only one driver 306 and level-shifter 308 are shown, the interconnect tile 111A can include a plurality of drivers and level-shifters coupled to outputs of the MUX logic 304.

The interconnect tile 111B includes a voltage control circuit 206, MUX logic 304, and a receiver 310. The voltage control circuit 206 derives a local voltage Vdd2 from the global handshaking voltage Vcc. The MUX logic 304 includes a plurality of inputs and a plurality of outputs. One of the inputs to the MUX logic 304 is coupled to an output of the receiver 310. While only a single receiver 310 is shown, the interconnect tile 111B can include other receivers coupled to inputs of the MUX logic 304. Some of the outputs of the MUX logic 304 can be coupled to inputs of the CLE tile 112B, while others of the outputs of the MUX logic 304 can be coupled to other logic tiles (not shown). The MUX logic 304 and the receiver 310 in the interconnect tile 111B operate using the local voltage Vdd2. An input of the receiver 310 is coupled to an output of the level-shifter 308 in the interconnect tile 111A. The receiver 310 is tolerant of an input signal having a logic-level referenced to the global handshaking voltage Vcc.

The CLE tile 112B includes a voltage control circuit 206 and logic 302. The voltage control circuit 206 derives a local voltage Vdd2 from the global handshaking voltage Vcc. The logic 302 operates using the local voltage Vdd2. The logic 302 can include lookup tables (LUTs), flip-flops, multiplexers, carry-chain logic, and the like.

The voltage control circuit 206 can any type of circuit configured to scale the global handshaking voltage Vcc to a local voltage. For example, the voltage control circuit 206 can perform voltage scaling using transistor threshold drops. The voltage control circuit 206 in each of the logic tiles can be programmable either using the configuration memory of the FPGA or through another control circuit. Thus, the logic tiles can be configured in either low power mode to use a local voltage, or in high-speed mode to use the global handshaking voltage.

In operation, the driver 306 is operable to use the local voltage Vdd1 to output a signal having a logic-level referenced to the local voltage Vdd1. The level-shifter 308 is coupled to receive the signal from the driver 306 and is operable to output a level-shifted signal having a logic-level referenced to the global handshaking voltage. The receiver 310 is operable to use the local voltage Vdd2 to receive the level-shifted signal from the level-shifter 308. In this manner, the interconnect tile 111A is operable to transmit a signal from one power domain to the interconnect tile 111B in another power domain using a level-shifted signal referenced to the global handshaking voltage. The interconnect tile 111B is not required to access the local voltage Vdd2 in order to transmit the signal to the interconnect tile 111B.

The interconnect tile 111A can include a plurality of drivers and level-shifters to transmit signals to a plurality of other interconnect tiles that are in the same or different power domains. Since the transmitted signals are referenced to the global handshaking voltage, the transmitted signals are agnostic to the destination power domain. While interconnect tiles are described by way of example, the same techniques can be used with other types of programmable tiles, such as CLE tiles, IOB tiles, BRAM tiles, DSP tiles, etc.

Figure 4:
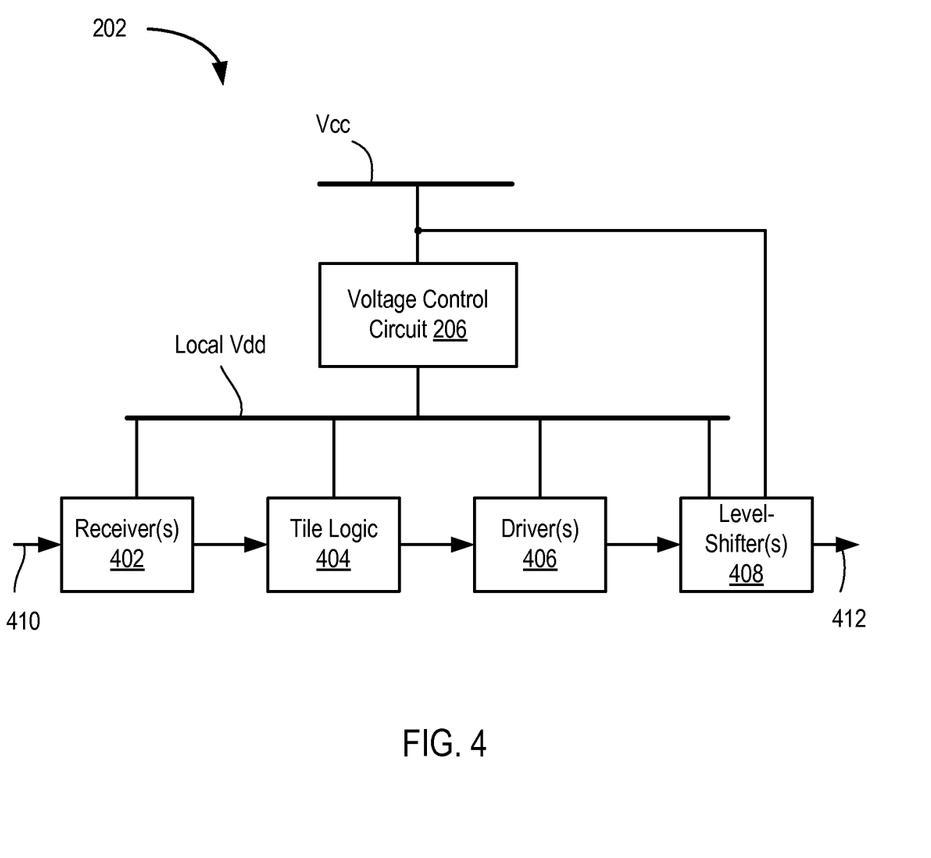
FIG. 4 is a block diagram depicting a logic tile in a programmable fabric according to an example.

FIG. 4 is a block diagram depicting a logic tile 202 in the programmable fabric 150 according to an example. The logic tile 202 can be any type of logic tile discussed above. The logic tile 202 generally includes a voltage control circuit 206, one or more receivers 402, tile logic 404, one or more drivers 406, and one or more level-shifters 408. The voltage control circuit 206 derived a local voltage Vdd from a global handshaking voltage Vcc. The receiver(s) 402 are coupled to input(s) 410. The input(s) 410 receive signal(s) referenced to the global handshaking voltage Vcc. The tile logic 404 receives signals referenced to the local voltage Vdd from the receiver(s) 402. The tile logic 404 includes various types of logic depending on the function of the tile. For example, the tile logic 404 can include multiplexer logic for an interconnect tile, CLE logic for a CLE tile, etc. Output(s) of the tile logic 404 is/are coupled to the driver(s) 406. The driver(s) 406 output signal(s) referenced to the local voltage Vdd. The level-shifter(s) 408 are coupled to the driver(s) 406 and output level-shifted signal(s) referenced to the global handshaking voltage Vcc. Output(s) 412 provide the level-shifted signals. Each of the receiver(s) 402, the tile logic 404, and the driver(s) 406 operate using the local voltage Vdd. The level-shifter(s) 408 can include dual-supply level-shifter circuit(s) that each operate using both the local voltage Vdd and the global handshaking voltage Vcc.

Figure 5:
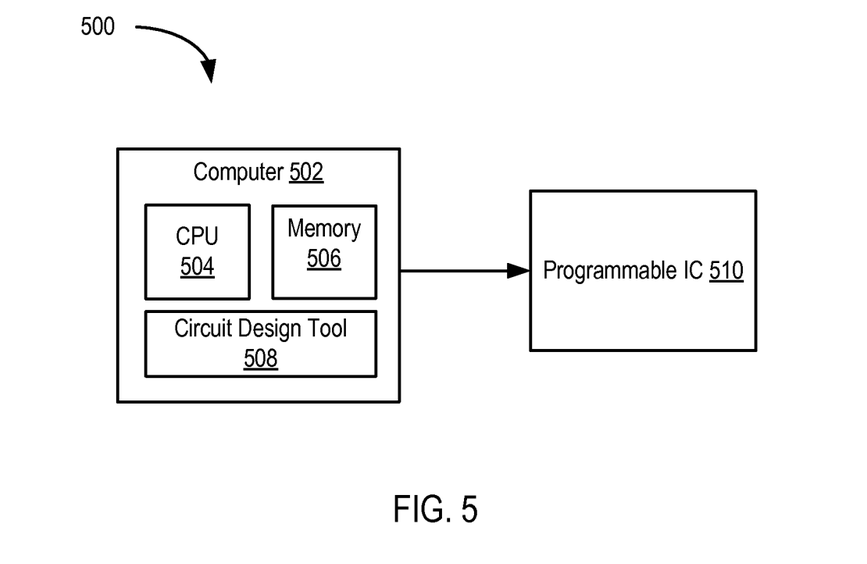
FIG. 5 is a block diagram depicting a system for configuring a programmable IC according to an example.

FIG. 5 is a block diagram depicting a system 500 for configuring a programmable IC according to an example. The system 500 includes a computer 502 coupled to a programmable IC 510. The computer 502 includes a central processing unit (CPU) 504 and memory circuits 506. The CPU 504 can comprise conventional microprocessor(s) known in the art. The memory circuits 506 can comprise random access memory (RAM), read only memory (RAM), and the like known in the art, as well as combinations thereof. The computer 502 can also include various other conventional components, such as storage devices, input/output devices, and the like. The computer 502 implements a circuit design tool 508 using the CPU 504 and the memory circuits 506. The circuit design tool 508 can be implemented using instructions, stored in the memory circuits 506, and executed by the CPU 504. The circuit design tool 508 is configured to generate a configuration bitstream to program the programmable IC 510. In an example, the circuit design tool 508 is used to implement a circuit in programmable IC 510 having multiple power domains, as described above.

Figure 6:
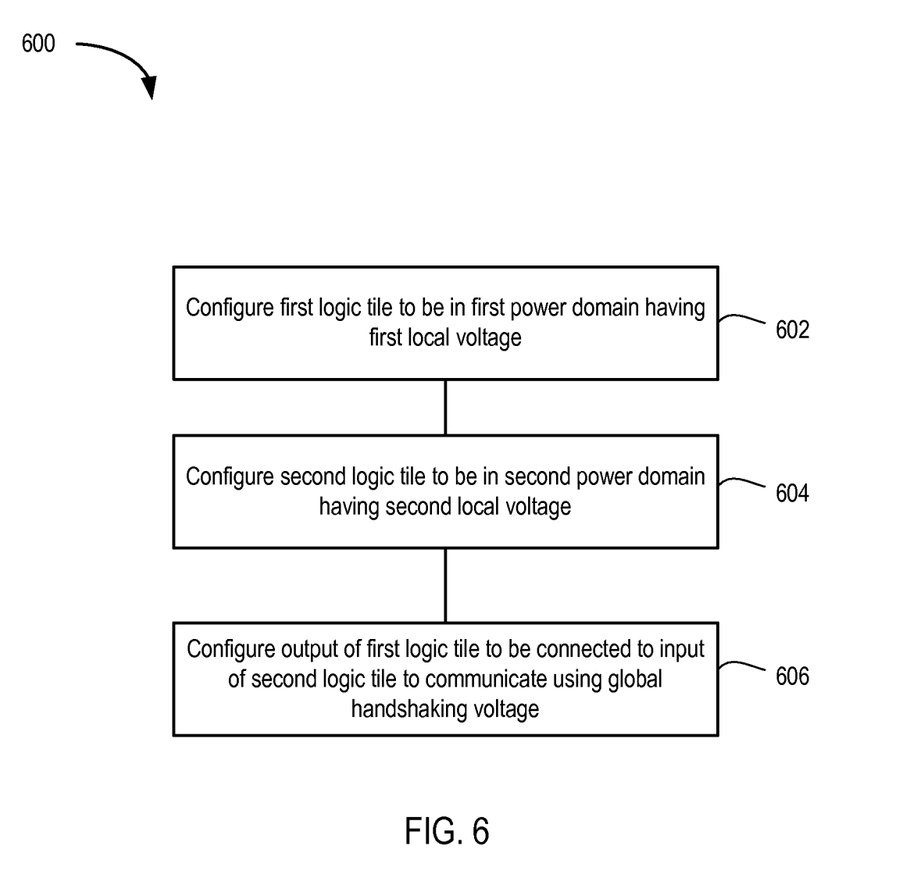
FIG. 6 is a flow diagram depicting a method of voltage scaling in a programmable IC according to an example.

FIG. 6 is a flow diagram depicting a method 600 of voltage scaling in a programmable IC according to an example. The method 600 can be performed by the circuit design tool 508 described above. The method 600 begins at operation 602, where the circuit design tool 508 configures a first logic tile to be in a first power domain having a first local voltage. At operation 604, the circuit design tool 508 configures a second logic tile to be in a second power domain having a second local voltage. At operation 606, the circuit design tool 508 configures output of the first logic tile to be connected to input of the second logic tile and to communicate using a signal referenced to the global handshaking voltage. The method 600 can be repeated or performed in parallel for various pairs of tiles in the programmable fabric of the programmable IC 510. The programmable IC 510 can include an implementation of the programmable fabric 150 having the power grid architecture described above.

While the foregoing is directed to specific examples, other and further examples may be devised without departing from the basic scope thereof, and the scope thereof is determined by the claims that follow.

What is claimed is:

1. A programmable integrated circuit (IC), comprising:
 a first logic tile in a first power domain having a first local voltage, the first logic tile including:
  a driver operable to use the first local voltage to output a signal having a logic-level referenced to the first local voltage; and
  a level-shifter coupled to receive the signal from the driver and operable to output a level-shifted signal having a logic-level referenced to a global handshaking voltage; and
 a second logic tile in a second power domain having a second local voltage, the second logic tile including a receiver operable to use the second local voltage to receive the level-shifted signal;

wherein the global handshaking voltage is at least as high as the first local voltage and at least as high as the second local voltage.

2. The programmable IC of claim 1, wherein the first logic tile includes a first voltage control circuit operable to derive the first local voltage from the global handshaking voltage, and wherein the second logic tile includes a second voltage control circuit operable to derive the second local voltage from the global handshaking voltage.

3. The programmable IC of claim 1, wherein the level-shifter is a dual-supply level shifter coupled to receive the first local voltage and the global handshaking voltage.

4. The programmable IC of claim 1, wherein the first logic tile comprises a first interconnect tile having first multiplexing logic operable using the first local voltage and coupled to the driver, and wherein the second logic tile comprises a second interconnect tile having second multiplexing logic operable using the second local voltage and coupled to the receiver.

5. The programmable IC of claim 4, wherein the first interconnect tile is in a first column of interconnect tiles adjacent a first column of configurable logic element tiles, and wherein the second interconnect tile is in a second column of interconnect tiles adjacent a second column of configurable logic element tiles.

6. The programmable IC of claim 5, wherein at least one additional column of logic tiles is disposed between the first column of interconnect tiles and the second column of interconnect tiles.

7. The programmable IC of claim 5, wherein a first configurable logic element in the first column of configurable logic elements adjacent the first interconnect tile is in the first power domain, and wherein a second configurable logic element in the second column of configurable logic elements adjacent the second interconnect tile is in the second power domain.

8. A programmable integrated circuit (IC), comprising:
   a voltage rail operable to supply a global handshaking voltage; and
   a plurality logic tiles, each of the plurality of logic tiles including:
      at least one driver each operable to use a local voltage to output a signal having a logic-level referenced to the local voltage;
      at least one level-shifter each coupled to receive the signal from a respective driver and operable to output a level-shifted signal having a logic-level referenced to the global-handshaking voltage; and
      at least one receiver each operable to use the local voltage to receive an input signal having a logic-level referenced to the global-handshaking voltage;
   wherein the global handshaking voltage is at least as high as the local voltage in each of the plurality of logic tiles.

9. The programmable IC of claim 8, wherein each of the plurality of logic tiles includes a voltage control circuit operable to derive the respective local voltage from the global handshaking voltage.

10. The programmable IC of claim 8, wherein each of the at least one level-shifter in each of the plurality of logic tiles is a dual-supply level shifter coupled to receive the respective local voltage and the global handshaking voltage.

11. The programmable IC of claim 8, wherein the plurality of logic tiles comprises a plurality of interconnect tiles.

12. The programmable IC of claim 11, wherein the plurality of interconnect tiles are disposed in a plurality of columns of interconnect tiles, and wherein each of the plurality of columns of interconnect tiles is adjacent a column of configurable logic element tiles.

13. The programmable IC of claim 12, wherein at least one additional column of logic tiles is disposed between at least one pair of the plurality of columns of interconnect tiles.

14. The programmable IC of claim 11, wherein each of the plurality of interconnect tiles comprises multiplexing logic coupled to the at least one driver and the at least one receiver.

15. A method of voltage scaling in a programmable integrated circuit (IC), comprising:
   configuring a first logic tile to be in a first power domain having a first local voltage;
   configuring a second logic tile to be in a second power domain having a second local voltage; and
   configuring an output of the first logic tile to be connected to an input of the second logic tile;
   wherein the output of the first logic tile is driven by a driver operable to use the first local voltage to output a signal having a logic-level referenced to the first local voltage, and a level-shifter coupled to receive the signal from the driver and operable to output a level-shifted signal having a logic-level referenced to a global handshaking voltage;
   wherein the input of the second logic tile is coupled to a receiver operable to use the second local voltage to receive the level-shifted signal; and
   wherein the global handshaking voltage is at least as high as the first local voltage and at least as high as the second local voltage.

16. The method of claim 15, wherein the operations of configuring the first logic tile and configuring the second logic tile comprise configuring a first voltage control circuit in the first logic tile to derive the first local voltage from the global handshaking voltage and configuring a second voltage control circuit in the second logic tile to derive the second local voltage from the global handshaking voltage.

17. The method of claim 15, wherein the level-shifter is a dual-supply level shifter coupled to receive the first local voltage and the global handshaking voltage.

18. The method of claim 15, wherein the first logic tile comprises a first interconnect tile having first multiplexing logic operable using the first local voltage and coupled to the driver, and wherein the second logic tile comprises a second interconnect tile having second multiplexing logic operable using the second local voltage and coupled to the receiver.

19. The method of claim 18, wherein the first interconnect tile is in a first column of interconnect tiles adjacent a first column of configurable logic element tiles, and wherein the second interconnect tile is in a second column of interconnect tiles adjacent a second column of configurable logic element tiles.

20. The method of claim 19, wherein at least one additional column of logic tiles is disposed between the first column of interconnect tiles and the second column of interconnect tiles.

* * * * *